United States Patent
Kister

(10) Patent No.: US 8,324,923 B2
(45) Date of Patent: *Dec. 4, 2012

(54) VERTICAL PROBE ARRAY ARRANGED TO PROVIDE SPACE TRANSFORMATION

(75) Inventor: January Kister, Portola Valley, CA (US)

(73) Assignee: Microprobe, Inc., Carlsbad, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/118,952

(22) Filed: May 31, 2011

(65) Prior Publication Data

US 2011/0273199 A1 Nov. 10, 2011

Related U.S. Application Data

(63) Continuation of application No. 12/419,912, filed on Apr. 7, 2009, now Pat. No. 7,952,377, which is a continuation of application No. 11/786,107, filed on Apr. 10, 2007, now Pat. No. 7,514,948.

(51) Int. Cl.
*G01R 31/26* (2006.01)
(52) U.S. Cl. .................................................. 324/762.1
(58) Field of Classification Search ............... None
See application file for complete search history.

(56) References Cited

U.S. PATENT DOCUMENTS

| | | | |
|---|---|---|---|
| 3,518,612 A | 6/1970 | Dunman et al. | |
| 3,599,093 A | 8/1971 | Oates | |
| 3,710,251 A | 1/1973 | Hagge et al. | |
| 3,812,311 A | 5/1974 | Kvaternik | |
| 4,027,935 A | 6/1977 | Byrnes et al. | |
| 4,115,736 A | 9/1978 | Tracy | |
| 4,116,523 A | 9/1978 | Coberly et al. | |
| 4,423,376 A | 12/1983 | Byrnes et al. | |
| 4,525,697 A | 6/1985 | Jones et al. | |
| 4,532,423 A | 7/1985 | Tojo et al. | |
| 4,567,433 A | 1/1986 | Ohkubo et al. | |
| 4,593,961 A | 6/1986 | Cosmo | |
| 4,618,767 A | 10/1986 | Smith et al. | |
| 4,618,821 A | 10/1986 | Lenz | |
| 4,706,019 A | 11/1987 | Richardson | |
| 4,730,158 A | 3/1988 | Kasai et al. | |
| 4,747,698 A | 5/1988 | Wickramasinghe et al. | |

(Continued)

FOREIGN PATENT DOCUMENTS

DE 4237591 5/1994

(Continued)

OTHER PUBLICATIONS

Levy, Larry , "Wafer Probe TM System", *Southwest Test Workshop*Formfactor Inc. Jun. 1997 , 1-19.

(Continued)

*Primary Examiner* — Jermele M Hollington
(74) *Attorney, Agent, or Firm* — Deborah A. Peacock; Samantha A. Updegraff; Peacock Myers, P.C.

(57) ABSTRACT

Improved probing of closely spaced contact pads is provided by an array of vertical probes having all of the probe tips aligned along a single contact line, while the probe bases are arranged in an array having two or more rows parallel to the contact line. With this arrangement of probes, the probe base thickness can be made greater than the contact pad spacing along the contact line, thereby advantageously increasing the lateral stiffness of the probes. The probe tip thickness is less than the contact pad spacing, so probes suitable for practicing the invention have a wide base section and a narrow tip section.

31 Claims, 4 Drawing Sheets

U.S. PATENT DOCUMENTS

| | | | |
|---|---|---|---|
| 4,757,255 A | 7/1988 | Margozzi |
| 4,772,846 A | 9/1988 | Reeds |
| 4,773,877 A | 9/1988 | Kruger et al. |
| 4,807,159 A | 2/1989 | Komatsu et al. |
| 4,901,013 A | 2/1990 | Benedetto et al. |
| 4,967,148 A | 10/1990 | Doemens et al. |
| 5,015,947 A | 5/1991 | Chism |
| 5,026,291 A | 6/1991 | David |
| 5,030,318 A | 7/1991 | Reche |
| 5,061,192 A | 10/1991 | Chapin et al. |
| 5,067,007 A | 11/1991 | Otsuka et al. |
| 5,145,384 A | 9/1992 | Asakawa et al. |
| 5,205,739 A | 4/1993 | Malo et al. |
| 5,207,585 A | 5/1993 | Byrnes |
| 5,225,771 A | 7/1993 | Leedy |
| 5,230,632 A | 7/1993 | Baumberger et al. |
| 5,237,743 A | 8/1993 | Busacco et al. |
| 5,354,205 A | 10/1994 | Feigenbaum et al. |
| 5,399,982 A | 3/1995 | Driller |
| 5,422,574 A | 6/1995 | Kister |
| 5,430,614 A | 7/1995 | Difrancesco |
| 5,436,571 A | 7/1995 | Karasawa |
| 5,476,211 A | 12/1995 | Khandros |
| 5,531,022 A | 7/1996 | Beaman et al. |
| 5,576,631 A | 11/1996 | Stowers et al. |
| 5,632,631 A | 5/1997 | Fjelstad et al. |
| 5,635,846 A | 6/1997 | Beaman et al. |
| 5,644,249 A | 7/1997 | Kister |
| 5,676,599 A | 10/1997 | Ricks et al. |
| 5,701,085 A | 12/1997 | Malladi |
| 5,720,098 A | 2/1998 | Kister |
| 5,742,174 A | 4/1998 | Kister et al. |
| 5,751,157 A | 5/1998 | Kister |
| 5,764,070 A | 6/1998 | Pedder |
| 5,764,072 A | 6/1998 | Kister |
| 5,764,409 A | 6/1998 | Colvin |
| 5,767,691 A | 6/1998 | Verkuil |
| 5,772,451 A | 6/1998 | Dozier, II et al. |
| 5,773,987 A | 6/1998 | Montoya |
| 5,802,699 A | 9/1998 | Fjelstad et al. |
| 5,806,181 A | 9/1998 | Khandros et al. |
| 5,821,763 A | 10/1998 | Beaman et al. |
| 5,829,128 A | 11/1998 | Eldridge et al. |
| 5,832,601 A | 11/1998 | Eldridge et al. |
| 5,834,946 A | 11/1998 | Albrow et al. |
| 5,847,936 A | 12/1998 | Forehand |
| 5,852,871 A | 12/1998 | Khandros |
| 5,864,946 A | 2/1999 | Eldridge et al. |
| 5,884,395 A | 3/1999 | Dabrowiecki et al. |
| 5,892,539 A | 4/1999 | Colvin |
| 5,914,613 A | 6/1999 | Gleason et al. |
| 5,917,707 A | 6/1999 | Khandros et al. |
| 5,923,178 A | 7/1999 | Higgins et al. |
| 5,926,951 A | 7/1999 | Khandros et al. |
| 5,932,323 A | 8/1999 | Throssel |
| 5,934,914 A | 8/1999 | Fjelstad et al. |
| 5,936,421 A | 8/1999 | Stowers et al. |
| 5,945,836 A | 8/1999 | Sayre et al. |
| 5,952,843 A | 9/1999 | Vinh |
| 5,969,533 A | 10/1999 | Takagi |
| 5,970,167 A | 10/1999 | Colvin |
| 5,974,662 A | 11/1999 | Eldridge et al. |
| 5,994,152 A | 11/1999 | Khandros et al. |
| 6,027,630 A | 2/2000 | Cohen |
| 6,029,344 A | 2/2000 | Khandros et al. |
| 6,031,282 A | 2/2000 | Jones et al. |
| 6,064,215 A | 5/2000 | Kister |
| 6,066,957 A | 5/2000 | Van Loan et al. |
| 6,071,630 A | 6/2000 | Tomaru et al. |
| 6,086,386 A | 7/2000 | Fjelstad et al. |
| 6,133,072 A | 10/2000 | Fjelstad |
| 6,184,576 B1 | 2/2001 | Jones et al. |
| 6,204,674 B1 | 3/2001 | Dabrowiecki et al. |
| 6,205,660 B1 | 3/2001 | Fjelstad et al. |
| 6,215,320 B1 | 4/2001 | Parrish |
| 6,218,203 B1 | 4/2001 | Khoury et al. |
| 6,246,245 B1 | 6/2001 | Akram et al. |
| 6,246,247 B1 | 6/2001 | Eldridge et al. |
| 6,247,228 B1 | 6/2001 | Distefano et al. |
| 6,255,126 B1 | 7/2001 | Mathieu et al. |
| 6,259,261 B1 | 7/2001 | Engelking et al. |
| 6,278,284 B1 | 8/2001 | Mori et al. |
| 6,292,003 B1 | 9/2001 | Fredrickson et al. |
| 6,334,247 B1 | 1/2002 | Beaman et al. |
| 6,336,269 B1 | 1/2002 | Eldridge et al. |
| 6,344,753 B1 | 2/2002 | Takada et al. |
| 6,411,112 B1 | 6/2002 | Das et al. |
| 6,419,500 B1 | 7/2002 | Kister |
| 6,420,887 B1 | 7/2002 | Kister et al. |
| 6,424,164 B1 | 7/2002 | Kister |
| 6,433,571 B1 | 8/2002 | Montoya |
| 6,437,584 B1 | 8/2002 | Gleason et al. |
| 6,441,315 B1 | 8/2002 | Eldridge et al. |
| 6,443,784 B1 | 9/2002 | Kimoto |
| 6,482,013 B2 | 11/2002 | Eldridge et al. |
| 6,483,328 B1 | 11/2002 | Eldridge et al. |
| 6,486,689 B1 | 11/2002 | Nishikawa |
| 6,496,026 B1 | 12/2002 | Long et al. |
| 6,525,552 B2 | 2/2003 | Kister |
| 6,529,021 B1 | 3/2003 | Yu et al. |
| 6,530,148 B1 | 3/2003 | Kister |
| 6,566,898 B2 | 5/2003 | Theissen et al. |
| 6,570,396 B1 | 5/2003 | Kister |
| 6,573,738 B1 | 6/2003 | Matsuo et al. |
| 6,575,767 B2 | 6/2003 | Satoh et al. |
| 6,576,485 B2 | 6/2003 | Zhou et al. |
| 6,586,955 B2 | 7/2003 | Fjelstad et al. |
| 6,615,485 B2 | 9/2003 | Eldridge et al. |
| 6,624,648 B2 | 9/2003 | Eldridge et al. |
| 6,633,176 B2 | 10/2003 | Takemoto et al. |
| 6,641,430 B2 | 11/2003 | Zhou et al. |
| 6,646,455 B2 | 11/2003 | Maekawa et al. |
| 6,676,438 B2 | 1/2004 | Zhou et al. |
| 6,677,245 B2 | 1/2004 | Zhou et al. |
| 6,690,185 B1 | 2/2004 | Khandros et al. |
| 6,707,311 B2 | 3/2004 | Hohenwarter |
| 6,727,719 B2 | 4/2004 | Liao et al. |
| 6,731,123 B2 | 5/2004 | Kimoto |
| 6,765,228 B2 | 7/2004 | Lin et al. |
| 6,825,422 B2 | 11/2004 | Eldridge et al. |
| 6,842,023 B2 | 1/2005 | Yoshida et al. |
| 6,847,221 B2 | 1/2005 | Kimoto et al. |
| 6,853,208 B2 | 2/2005 | Okubo et al. |
| 6,881,974 B2 | 4/2005 | Wood et al. |
| 6,890,185 B1 | 5/2005 | Kister et al. |
| 6,897,666 B2 | 5/2005 | Swettlen et al. |
| D507,198 S | 7/2005 | Kister |
| 6,917,102 B2 | 7/2005 | Zhou et al. |
| 6,917,525 B2 | 7/2005 | Mok et al. |
| D510,043 S | 9/2005 | Kister |
| 6,945,827 B2 | 9/2005 | Grube et al. |
| 6,956,389 B1 | 10/2005 | Mai |
| 6,965,244 B2 | 11/2005 | Miller |
| 6,965,245 B2 | 11/2005 | Kister et al. |
| 6,970,005 B2 | 11/2005 | Rincon et al. |
| 7,015,707 B2 | 3/2006 | Cherian |
| 7,036,221 B2 | 5/2006 | Higashida et al. |
| 7,046,021 B2 | 5/2006 | Kister |
| 7,059,865 B2 | 6/2006 | Kister et al. |
| 7,064,564 B2 | 6/2006 | Kister et al. |
| D525,207 S | 7/2006 | Kister et al. |
| 7,071,715 B2 | 7/2006 | Shinde et al. |
| 7,073,254 B2 | 7/2006 | Eldridge et al. |
| 7,078,921 B2 | 7/2006 | Haga et al. |
| 7,088,118 B2 | 8/2006 | Liu et al. |
| 7,091,729 B2 | 8/2006 | Kister |
| 7,108,546 B2 | 9/2006 | Miller et al. |
| 7,109,731 B2 | 9/2006 | Gleason et al. |
| 7,126,361 B1 | 10/2006 | Anderson et al. |
| 7,143,500 B2 | 12/2006 | Byrd |
| 7,148,709 B2 | 12/2006 | Kister |
| 7,150,658 B1 | 12/2006 | Chien |
| 7,173,441 B2 | 2/2007 | Kister et al. |
| 7,189,078 B2 | 3/2007 | Kister et al. |
| 7,202,682 B2 | 4/2007 | Cooper et al. |
| 7,217,138 B2 | 5/2007 | Kister et al. |
| 7,218,127 B2 | 5/2007 | Cooper et al. |

| | | |
|---|---|---|
| 7,218,131 B2 | 5/2007 | Tanioka et al. |
| 7,225,538 B2 | 6/2007 | Eldridge et al. |
| 7,227,371 B2 | 6/2007 | Miller |
| 7,265,565 B2 | 9/2007 | Chen et al. |
| 7,274,195 B2 | 9/2007 | Takemoto et al. |
| 7,281,305 B1 | 10/2007 | Iyer |
| 7,285,966 B2 | 10/2007 | Lee et al. |
| 7,312,617 B2 | 12/2007 | Kister |
| 7,345,492 B2 | 3/2008 | Kister |
| 7,417,447 B2 | 8/2008 | Kister |
| 7,436,192 B2 | 10/2008 | Kister |
| 7,511,523 B2 | 3/2009 | Chen et al. |
| 7,514,948 B2 | 4/2009 | Kister |
| 7,649,367 B2 | 1/2010 | Kister |
| 7,659,739 B2 | 2/2010 | Kister |
| 7,671,610 B2 | 3/2010 | Kister |
| 7,759,949 B2 | 7/2010 | Kister |
| 7,786,740 B2 | 8/2010 | Kister |
| 2001/0012739 A1 | 8/2001 | Grube et al. |
| 2001/0040460 A1 | 11/2001 | Beaman et al. |
| 2002/0070743 A1 | 6/2002 | Felici et al. |
| 2002/0125584 A1 | 9/2002 | Umehara et al. |
| 2002/0153913 A1 | 10/2002 | Okubo et al. |
| 2002/0190738 A1 | 12/2002 | Beaman et al. |
| 2002/0194730 A1 | 12/2002 | Shih et al. |
| 2003/0027423 A1 | 2/2003 | Zhou et al. |
| 2003/0116346 A1 | 6/2003 | Forster et al. |
| 2004/0036493 A1 | 2/2004 | Miller |
| 2004/0046579 A1 | 3/2004 | Chraft et al. |
| 2004/0104737 A1 | 6/2004 | Haga et al. |
| 2004/0119485 A1 | 6/2004 | Koch et al. |
| 2004/0239352 A1 | 12/2004 | Mizoguchi |
| 2005/0012513 A1 | 1/2005 | Cheng et al. |
| 2005/0184743 A1 | 8/2005 | Kimura |
| 2006/0033516 A1 | 2/2006 | Rincon et al. |
| 2006/0040417 A1 | 2/2006 | Eldridge et al. |
| 2006/0073712 A1 | 4/2006 | Suhir |
| 2006/0082380 A1 | 4/2006 | Tanioka et al. |
| 2006/0170440 A1 | 8/2006 | Sudin |
| 2006/0171425 A1 | 8/2006 | Lee et al. |
| 2007/0145989 A1 | 6/2007 | Zhu et al. |
| 2007/0167022 A1 | 7/2007 | Tsai et al. |
| 2007/0229103 A1 | 10/2007 | Tani |
| 2008/0074132 A1 | 3/2008 | Fan et al. |
| 2008/0088331 A1 | 4/2008 | Yoshida |
| 2008/0258746 A1 | 10/2008 | Tran et al. |
| 2010/0176832 A1 | 7/2010 | Kister |
| 2010/0182030 A1 | 7/2010 | Kister |
| 2010/0182031 A1 | 7/2010 | Kister |
| 2010/0289512 A1 | 11/2010 | Kister |
| 2011/0006796 A1 | 1/2011 | Kister |
| 2011/0062978 A1 | 3/2011 | Kister |
| 2011/0273198 A1 | 11/2011 | Kister |

FOREIGN PATENT DOCUMENTS

| | | |
|---|---|---|
| DE | 4237591 A1 | 5/1994 |
| EP | 0144682 | 6/1985 |
| EP | 0764352 | 5/2004 |
| JP | 63-307678 | 12/1988 |
| JP | 01128535 | 5/1989 |
| JP | 7-21968 | 1/1995 |
| JP | 7-333232 | 12/1995 |
| JP | 10-506238 | 6/1998 |
| JP | 10-221374 | 8/1998 |
| JP | 10311864 | 11/1998 |
| JP | 11044727 | 2/1999 |
| JP | 11241690 | 8/1999 |
| TW | 201109669 | 3/2011 |
| WO | WO 8704568 | 7/1987 |
| WO | WO 92/10010 | 6/1992 |
| WO | WO 96/15458 | 5/1996 |
| WO | WO 96/37332 | 11/1996 |
| WO | WO 9743653 | 11/1997 |
| WO | WO 00/54066 | 9/2000 |
| WO | WO 01/09623 | 2/2001 |

OTHER PUBLICATIONS

Sporck, Nicholas, "A New Probe Card Technology Using Compliant Microsprings", *Proceedings 1997 IEEE International Test Conference* Nov. 1, 1997, 527-532.

VERTICAL PROBE ARRAY ARRANGED TO PROVIDE SPACE TRANSFORMATION

CROSS-REFERENCE TO RELATED APPLICATIONS

This application is a continuation application of U.S. patent application Ser. No. 12/419,912 (now U.S. Pat. No. 7,952,377), entitled "Vertical Probe Array Arranged to Provide Space Transformation", to January Kister, filed Apr. 7, 2009, which is a continuation application of U.S. patent application Ser. No. 11/786,107 (now U.S. Pat. No. 7,514,948) entitled "Vertical Probe Array Arranged to Provide Space Transformation", to January Kister, filed on Apr. 10, 2007, and the specifications and claims of all the applications listed above are incorporated herein by reference.

BACKGROUND OF THE INVENTION

1. Field of the Invention (Technical Field)

This invention relates to probe arrays for testing integrated electrical circuits.

2. Description of Related Art

Integrated electrical circuits are typically tested prior to final dicing and packaging. Such testing usually entails making temporary electrical contact to contact pads on the circuit or chip being tested. Probes or probe arrays are commonly employed to make such temporary electrical contact. Probes or probe arrays for this application have been under development for many years, since the ongoing technological evolution of chips and integrated circuitry to ever-smaller dimensions tends to raise problems which require new probing solutions.

For example, vertical probes have evolved significantly over time. In a vertical probe, at least a substantial portion of the probe is aligned along the vertical direction, where "vertical" is conventionally taken to the direction of probe travel when making contact. Vertical probes can provide improved control of scrub motion of the probe tip relative to the contact pad as contact is made, e.g., as described in U.S. Pat. No. 7,148,709 by the present inventor. Such improved control of scrub motion is increasingly important as contact pad dimensions decrease. Various aspects of arrays of vertical probes are also considered in U.S. Pat. No. 7,148,709, as well as in U.S. Pat. Nos. 6,443,784, 6,731,123, and 6,847,221.

Vertical probes often have a well-defined probe plane, such that deformation of the probe during contact occurs primarily in the probe plane without significant lateral (i.e. out of plane) motion. This situation is preferred in practice, because it allows an array of vertical probes to be closely spaced in a direction perpendicular to the probe plane, thereby facilitating making contact to a corresponding array of closely spaced contact pads. As long as the probe deformation is in-plane, undesirable contact between adjacent probes as a result of probe deformation during contact will not occur.

However, this approach can encounter difficulty as the contact pad spacing decreases, since decreased probe width (to accommodate the reduced contact pad spacing) can lead to an undesirable tendency of the probes to laterally deform. Such lateral probe deformation is highly undesirable, since it can lead to electrical contact between different probes of the same probe array. Accordingly, it would be an advance in the art to provide probing of closely spaced contact pads with a vertical probe array having a reduced tendency for probes to laterally deform.

BRIEF SUMMARY OF EMBODIMENTS OF THE PRESENT INVENTION

Improved probing of closely spaced contact pads is provided by an array of vertical probes having all of the probe tips aligned along a single contact line, while the probe bases are arranged in an array having two or more rows parallel to the contact line. With this arrangement of probes, the probe base thickness can be made greater than the contact pad spacing along the contact line, thereby advantageously increasing the lateral stiffness of the probes. The probe tip thickness is less than the contact pad spacing, so probes suitable for practicing the invention have a wide base section and a narrow tip section.

The invention is also suitable for probing two parallel rows of closely spaced contact pads. In such applications, the rows of contact pad may or may not be offset from each other. The invention is suitable for use with any kind or shape of vertical probe, provided the lateral probe thickness varies as described above. For example, knee probes can be employed where the probe tip is aligned with the probe base axis (i.e., the knee "goes out" as much as it "comes back in"), or where the probe tip is between the probe base axis and the knee (i.e., the knee goes out more than it comes back in), or where the probe base axis is between the probe tip and the knee (i.e., the knee goes out less than it comes back in.

DETAILED DESCRIPTION OF THE INVENTION

Figures 1, 2:
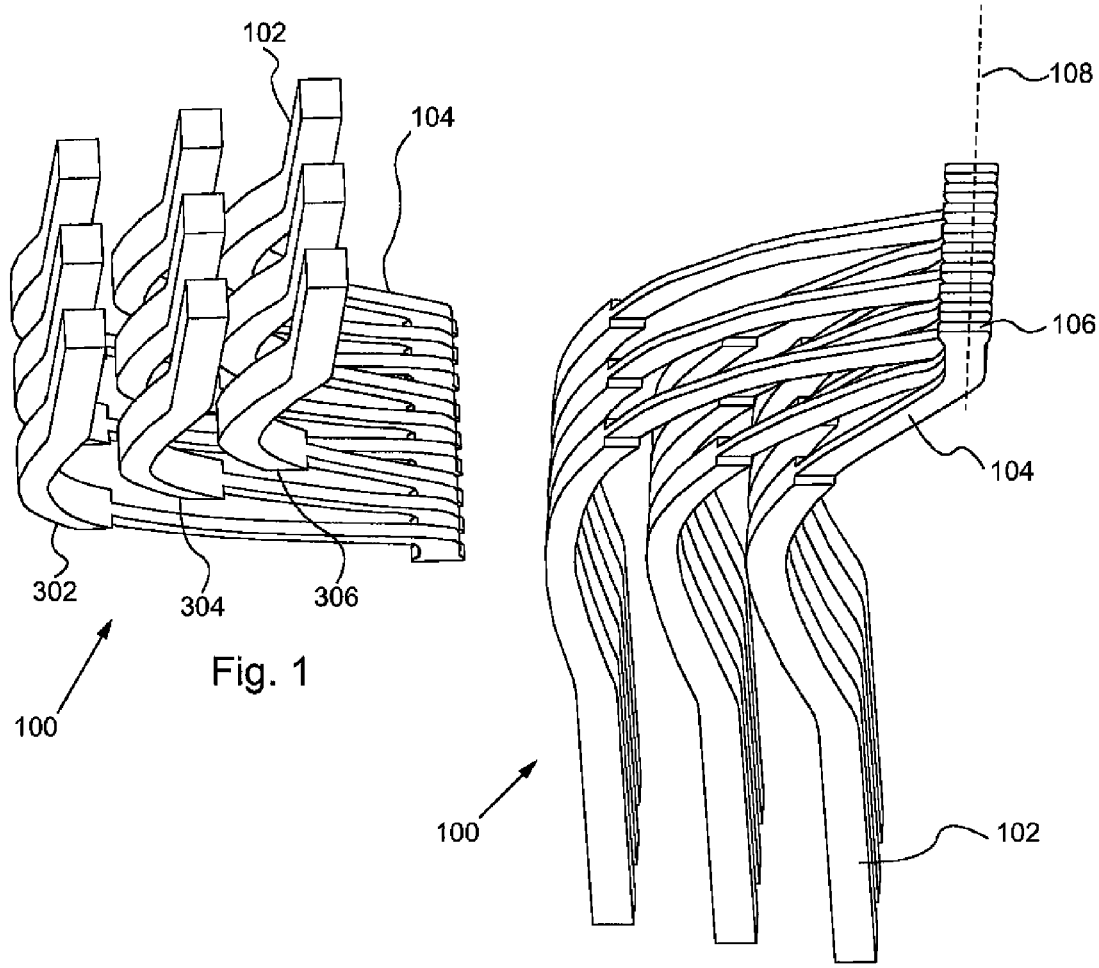
FIG. 1 shows an oblique top view of a probe array according to an embodiment of the invention.
FIG. 2 shows an oblique bottom view of the probe array of FIG. 1.
Figure 3:
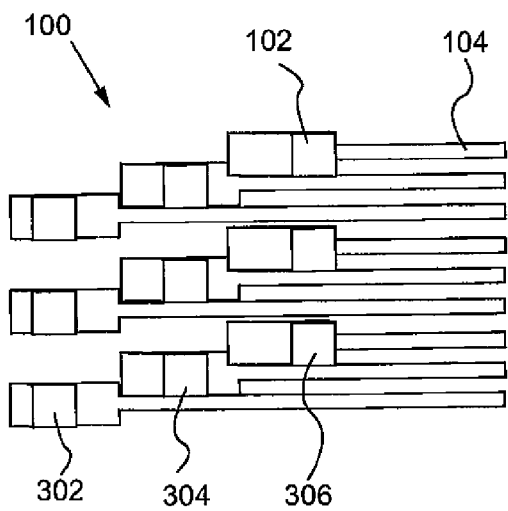
FIG. 3 shows a top view of the probe array of FIG. 1.
Figure 4:
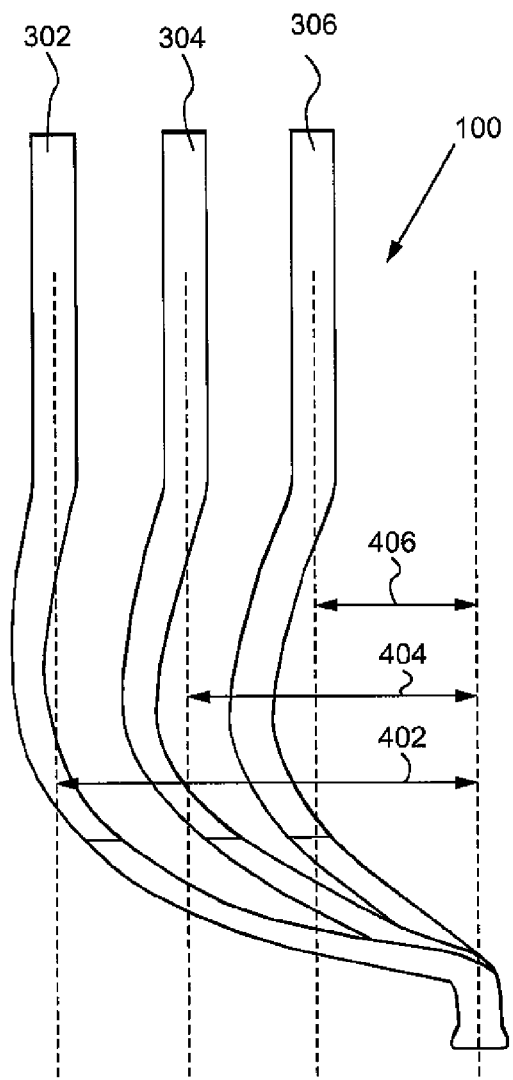
FIG. 4 shows a side view of the probe array of FIG. 1.

FIGS. 1-4 show various views of a probe array according to an embodiment of the invention. More specifically, FIG. 1 shows an oblique top view, FIG. 2 shows an oblique bottom view, FIG. 3 shows a top view, and FIG. 4 shows a side view. In these views, a probe array 100 includes several vertical probes, some of which are labeled as 302, 304, and 306. Each probe in the array has a base section (e.g., base section 102) and a tip section (e.g., tip section 104), where the base section and the tip section are at opposite ends of the probe. Each probe tip section has a tip contact surface (e.g., contact section 106) for making electrical contact to a device under test. The direction of probe base section motion as contact is made is vertical on FIG. 4 (i.e., parallel to the dotted lines of FIG. 4). The tip sections of the probes are disposed such that the corresponding tip contact surfaces are disposed along a straight contact line (108 on FIG. 2).

The base sections of the probes are disposed in a two-dimensional base array having at least two rows parallel to the contact line. In the example of FIGS. 1-4, there are three rows in the base array. A thickness of the base sections along the rows is substantially larger than a center to center spacing of adjacent tip contact surfaces along the contact line (e.g., as shown on FIGS. 1-4). In this manner, closely spaced contact pads can be probed with a vertical probe array without requiring the entire length of the probes to have a thickness smaller than the contact pad spacing. Only the tip sections of the probes need to have such a small thickness. The base sections can be made thicker, which is advantageous for preventing lateral deformation (i.e., deformation in the direction of contact line 108) of probes when contact is made to the device under test. This arrangement of probes can be regarded as proving a space transformation function from a single row of contact pads to multiple rows in the base array.

Although it is not required, it is usually preferred for probes in each row of the base array to have the same shape. In this example, probes in the same row as probe 302 have the same shape as probe 302, probes in the same row as probe 304 have the same shape as probe 304, and probes in the same row as probe 306 have the same shape as probe 306. Since the distance between the rows of the base array and the contact line varies from row to row, probe shapes differ from row to row. Thus any two probes belonging to different rows of the base array will have different shapes.

To define how the probe shapes differ from row to row, it is helpful to define a tip to base offset for each probe. For example, FIG. 4 shows tip to base offsets 402, 404, and 406 for probes 302, 304, and 306 respectively. Adjacent rows have tip to base offsets which differ by the spacing between the adjacent rows, thereby providing alignment of the tips to a single contact line. For vertical knee probes, as in the example of FIGS. 1-4, it is important to note that the base to tip offset for a particular probe can be positive, zero, or negative. Without loss of generality, the tip to base offsets shown on FIG. 4 are taken to be positive. Thus a positive tip to base offset relates to a knee probe where the base axis is between the tip and the knee. Another way to describe a positive offset is that the knee "comes back in" further than it "goes out" as one moves from base to tip. Thus a negative tip to base offset relates to a situation where the knee "goes out" more than it "comes back in" as one moves from base to tip. The resulting probe configuration has the tip between the base axis and the knee. Finally, a tip offset of zero relates to the case where the tip and base axis are aligned.

Although the example of FIGS. 1-4 shows all probes having a positive tip to base offset, the invention can be practiced with probes have positive, negative and/or zero offset, provided the offsets vary from row to row as described above.

To provide uniformity of probing, it is preferred for each of the vertical probes in the probe array to provide substantially the same scrub motion between tip contact surface and the contact pad of the device under test as contact is made. The tip to base offset is an important parameter that can significantly affect the scrub motion of the probe, as described in greater detail in U.S. Pat. No. 7,148,709 and in U.S. patent application Ser. No. 11/450,977, both by the present inventor. However, vertical probe designs have other degrees of freedom for controlling the scrub motion in addition to the tip to base offset, so these other parameters can vary from row to row in such a way as to compensate for the effect of the different offsets for each row.

Embodiments of the invention are particularly suitable for probing closely spaced contact pads, since conventional vertical probing of such contact pads can encounter difficulties as described above. For example, in practicing the invention, the center to center spacing of the tip contact surfaces along the contact line can be from about 50 µm to about 100 µm. The center to center spacing of the base sections along the rows of the base array is preferably between about 150 µm and about 200 µm.

It is preferred for each of the probes to deform primarily in a single plane, with minimal out-of plane deformation during contact. This probe plane (or deformation plane) is perpendicular to contact line 108 (i.e., it is the plane of FIG. 4). This property, which is enabled by the increased thickness of the base sections compared to the tip sections, is highly desirable for avoiding probe-to-probe electrical shorts during device test.

Figure 5:
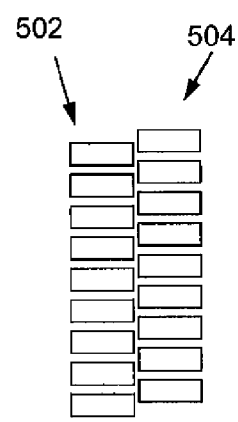
FIG. 5 shows two rows of contact pads having an offset with respect to each other.
Figure 6:
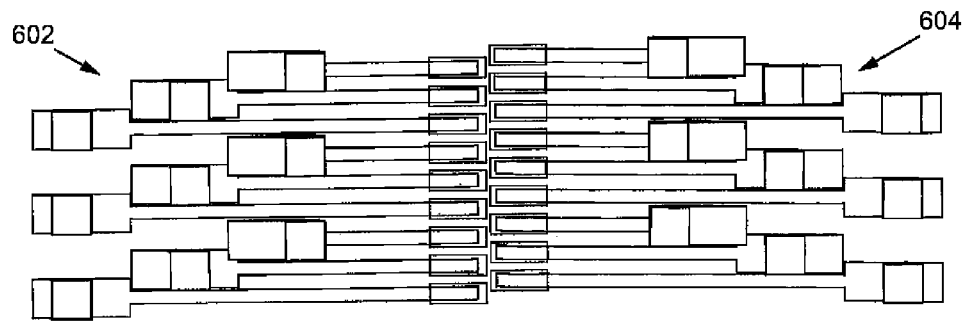
FIG. 6 shows an embodiment of the invention where contact is made to two staggered rows of contact pads as in FIG. 5.

Although the preceding description relates to an example where a probe array according to an embodiment of the invention is configured to make contact to a single row of contact pads, the invention is also applicable to making contact to two or more rows of contact pads. For example, contact can be made to two rows of contact pads 502 and 504, as shown on FIG. 5. More specifically, FIG. 6 shows a top view of an embodiment of the invention where two probe arrays (602 and 604) are configured to make contact to two rows of contact pads (as on FIG. 5). Each row of contact pads has its corresponding array of probes, and each of these arrays provides a one row to multiple row space transformation as described above.

In making contact to multiple rows of contact pads according to embodiments of the invention, the rows of contact pads can have any arrangement relative to each other. However, devices under test often provide rows of contact pads that are parallel to each other, have the same contact pad spacing and are offset from each other by a tip row offset that is about half the contact pad spacing (e.g., as shown on FIG. 5). For example, contact pads having a spacing of about 50 µm to about 100 µm can have an offset of about 25 µm to about 50 µm. Thus a preferred embodiment of the invention provides corresponding probe arrays (e.g., as shown on FIG. 6).

Figure 7:
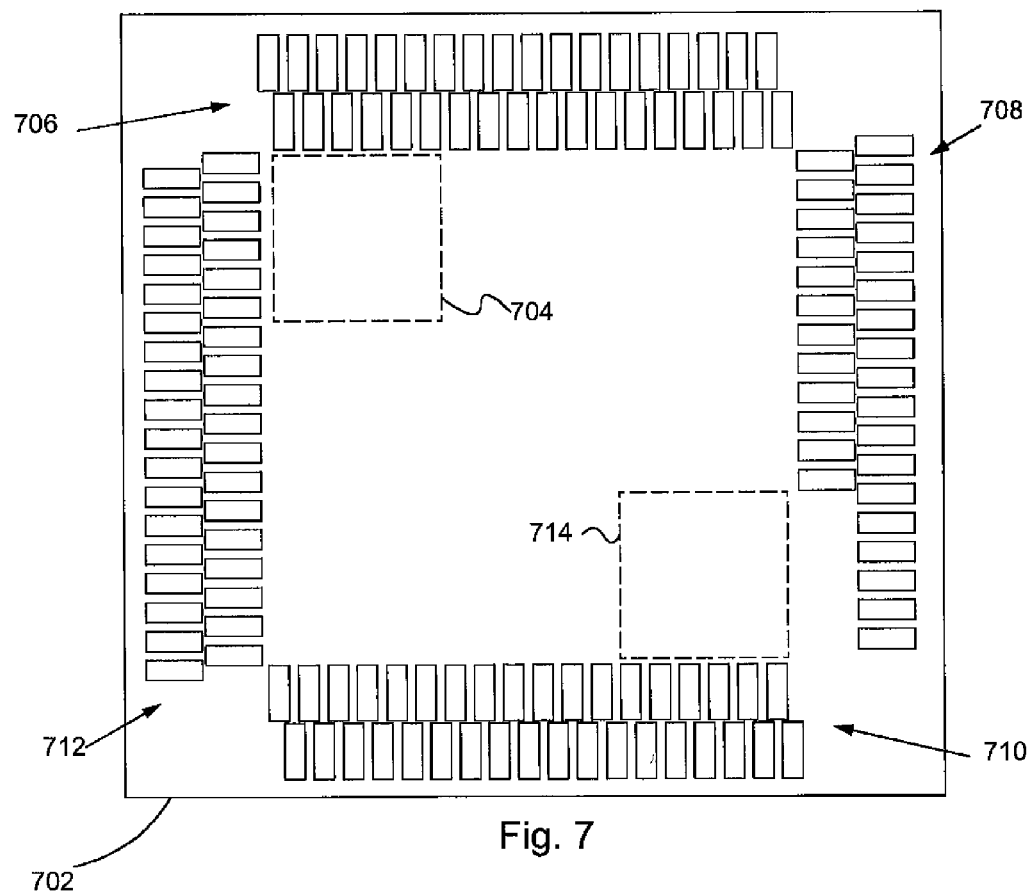
FIG. 7 shows an example of an integrated electric circuit having staggered rows of contact pads.

FIG. 7 shows an example of an integrated electric circuit having staggered rows of contact pads. Circuit 702 includes 4 sets of contact pads, 706, 708, 710, and 712, each of which can be probed with a corresponding probe array as described above in connection with FIG. 6. In corner overlap regions, such as region 704, probes corresponding to one set of contact pads (e.g., set 706) may interfere with probes from another set of contact pads (e.g., set 712). If such interference is of concern, the affected contact pads can be probed by conventional methods that avoid probe interference, or the contact pads can be arranged to eliminate the interference. For example, probes for contact pad set 710 extend into corner overlap region 714, but contact pad set 708 is configured such that none of its corresponding probes need to extend into region 714. In this manner, interference between probes can be avoided in practicing the invention.

Figure 8:
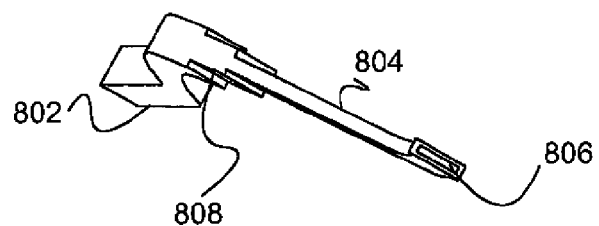
FIG. 8 is an oblique bottom view of a probe suitable for use in another embodiment of the invention.

The preceding description is by way of example as opposed to limitation, so the invention can also be practiced according to many variations of the preceding embodiments. For example, it is not critical exactly how the probe thickness decreases in the transition from base section to tip section. A single abrupt transition as shown on FIGS. 1-4 is one possibility. FIG. 8 shows a probe having a base section 802, a tip section 804 and a base to tip transition region 808 to reduce stress concentration at the transitions and to increase overall probe stiffness. Such a "stepped taper" is compatible with layer by layer probe fabrication, which is preferred for fabricating probes according to embodiments of the invention. The example of FIG. 8 shows a stepped taper having two transitions. Any number of transitions in a stepped taper can be employed in practicing the invention.

In practicing the invention, details of the probe tip shape are also not critical. However, a "skate" (e.g., 806 on FIG. 8) on the tip contact surface having a narrower width that the probe tip is a preferred configuration compared to the full-width contact surface 106 of FIG. 2.

Figure 9:
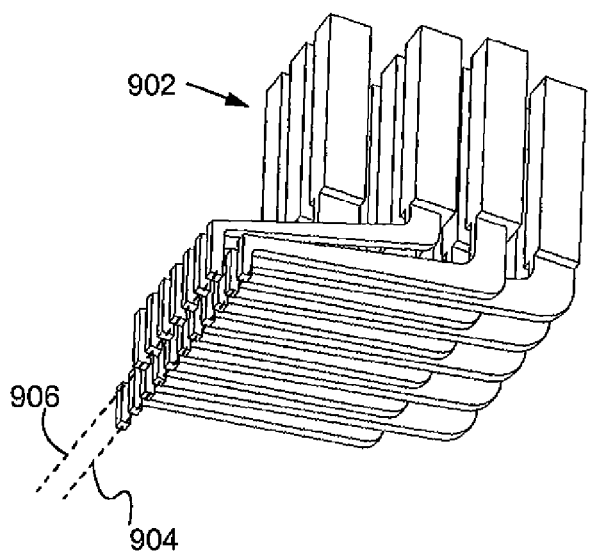
FIG. 9 is an oblique bottom view of a probe array suitable for use in yet another embodiment of the invention.
Figure 10:
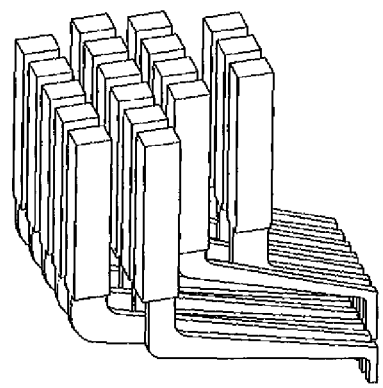
FIG. 10 is an oblique top view of the probe array of the embodiment of FIG. 9.

Details of the overall probe shape are also not critical in practicing the invention. FIGS. 9 and 10 show two views of a probe array according to an embodiment of the invention where the probes have straight vertical sections 902. In contrast, the example of FIGS. 1-4 shows probes having curved vertical sections. The example of FIGS. 9 and 10 also shows making contact to two rows of contact pads (i.e., along lines 904 and 906), as in the example of FIG. 6. However, the example of FIG. 6 shows the probe arrays arranged on opposite sides of the contact lines, while the example of FIGS. 9 and 10 shows the probe arrays arranged on the same side of the contact lines. This possibility provides another solution to the problem of possible probe interference as described in connection with FIG. 7, since sets of contact pads 706, 708, 710, and 712 can all be probed from outside the square they form.

Suitable materials for probes and probe tips to be included in probe arrays of the invention are well known in the art, and any such materials can be employed in practicing the invention. Suitable tip materials are electrically conductive and wear-resistant, and include Rh and Cr. Suitable probe fabrication, manufacturing, assembly and mounting methods for making probe arrays according to embodiments of the invention are also well known in the art.

What is claimed is:

1. A probe array comprising:
   at least three rows of probes each said probe comprising a base section and a tip section;
   said adjacent tip sections of said probes comprising a first center to center spacing;
   said adjacent base sections of said probes in each said row comprising a second center to center spacing;
   a substantially horizontal distance between said rows varying from row to row; and
   said probes contacting a single row of contact pads on a contact surface.

2. The apparatus of claim 1 wherein said probe array contacts a contact surface and said rows of said probe array are parallel to a plurality of contact pads on the contact surface, wherein the contact pads are contacted by said tip sections.

3. The apparatus of claim 1 wherein said second center to center spacing is greater than said first center to center spacing.

4. The apparatus of claim 1 wherein said probes comprise vertical probes.

5. The apparatus of claim 4 wherein said vertical probes comprise straight sections.

6. The apparatus of claim 4 wherein said vertical probes comprise curved sections.

7. The apparatus of claim 1 wherein said probes in each said row of said probe array comprise a same shape.

8. The apparatus of claim 1 wherein said probes in each said row of said probe array comprise a different shape.

9. The apparatus of claim 1 wherein said probes provide a substantially same scrub motion on a contact surface.

10. The apparatus of claim 1 wherein said base sections are thicker than said tip sections.

11. The apparatus of claim 1 wherein said probes comprise vertical knee probes.

12. The apparatus of claim 1 wherein at least one said probe comprises a positive base to tip offset.

13. The apparatus of claim 1 wherein at least one said probe comprises a negative base to tip offset.

14. The apparatus of claim 1 wherein at least one said probe comprises a zero base to tip offset.

15. The apparatus of claim 1 wherein said base sections comprise thicknesses greater than said center to center spacing of said adjacent tip sections.

16. The apparatus of claim 1 wherein said tip sections are aligned along an axis.

17. The apparatus of claim 16 wherein all said rows of said base array are disposed on a same side of said axis.

18. The apparatus of claim 1 wherein said first center to center spacing of said tip sections is from about 50 µm to about 100 µm.

19. The apparatus of claim 1 wherein said second center to center spacing of said base sections is between about 150 µm to about 200 µm.

20. The apparatus of claim 1 wherein said probes deform primarily in a single plane.

21. The apparatus of claim 1 wherein said probes deform primarily in a single plane, said plane perpendicular to an axis.

22. The apparatus of claim 1 wherein said probes have minimal out-of-plane deformation during contact.

23. The apparatus of claim 1 comprising multiple probe arrays for contacting multiple rows of contact pads on a contact surface.

24. The apparatus of claim 1 wherein said rows of said base array are staggered.

25. The apparatus of claim 1 wherein said probes contact a plurality of contact pads disposed in a corner of an integrated electric circuit.

26. The apparatus of claim 1 wherein said probes comprise at least one base to tip transition region.

27. The apparatus of claim 1 wherein each said tip section comprises a skate.

28. The apparatus of claim 27 wherein said skates comprise a narrower width than said tip sections.

29. The apparatus of claim 1 wherein said tip sections comprise an electrically conductive and wear-resistant material.

30. The apparatus of claim 29 wherein said tip sections comprise Rh.

31. The apparatus of claim 29 wherein said tip sections comprise Cr.

* * * * *